(12) United States Patent
Huang (10) Patent No.: US 9,883,579 B1
(45) Date of Patent: Jan. 30, 2018

(54) PACKAGE STRUCTURE AND MANUFACTURING METHOD THEREOF

(71) Applicant: Unimicron Technology Corp., Taoyuan (TW)

(72) Inventor: Hsiang-Hung Huang, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/353,726

(22) Filed: Nov. 16, 2016

(30) Foreign Application Priority Data

Oct. 7, 2016 (TW) .............................. 105132525 A (51) Int. Cl.
*H05K 7/20* (2006.01)
*H05K 1/02* (2006.01)
(Continued)

(52) U.S. Cl.
CPC ........... *H05K 1/0203* (2013.01); *H05K 1/113* (2013.01); *H05K 1/116* (2013.01); *H05K 1/182* (2013.01);
(Continued)

(58) Field of Classification Search
CPC . G06F 1/181–1/182; H05K 7/20218–7/20381;
(Continued)

(56) References Cited

U.S. PATENT DOCUMENTS 6,229,702 B1 * 5/2001 Tao ...................... H01L 23/3675
165/80.2
6,740,970 B2 * 5/2004 Hiraoka .............. H01L 23/3121
257/707
(Continued)

FOREIGN PATENT DOCUMENTS

CN 205320439 6/2016
TW 201436684 9/2014
(Continued)

OTHER PUBLICATIONS

"Office Action of China Counterpart Application," dated May 8, 2017, p. 1-p. 5.

*Primary Examiner* — Anthony Haughton
*Assistant Examiner* — Razmeen Gafur
(74) *Attorney, Agent, or Firm* — JCIPRNET (57) ABSTRACT

A package structure includes a circuit substrate, first and second build-up circuit structures, and a plurality of piezoelectric heat dissipation units. The circuit substrate includes a core layer, a plurality of electronic devices, and a conducting unit. The electronic devices are embedded in the core layer, and active surfaces of the two adjacent electronic devices respectively face a first surface and a second surface of the core layer. The conducting unit is disposed on the core layer and electrically connected to the electronic devices. The first and second build-up circuit structures are respectively disposed on the first and the second surfaces and respectively have at least one first and at least one second openings. The piezoelectric heat dissipation units respectively correspond to the active surfaces of the electronic devices and are electrically connected to the conducting unit exposed by the first and the second openings.

20 Claims, 10 Drawing Sheets

(51) Int. Cl.
  *H05K 1/18* (2006.01)
  *H05K 1/11* (2006.01)
  *H05K 3/30* (2006.01)
  *H05K 3/46* (2006.01)
  *H05K 3/40* (2006.01)
  *H01L 23/473* (2006.01)

(52) U.S. Cl.
  CPC ............. H05K 3/30 (2013.01); H05K 3/4007 (2013.01); H05K 3/4084 (2013.01); H05K 3/4644 (2013.01); H05K 2201/10083 (2013.01); H05K 2201/10734 (2013.01)

(58) Field of Classification Search
  CPC .................. H05K 7/20409–7/20418; H05K 7/20009–7/202; H01L 23/367–23/3677; H01L 23/473; H01L 23/46–23/467
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | | |
|---|---|---|---|---|
| 7,514,768 B2* | 4/2009 | Andoh | ................ | H01L 23/3128 165/80.3 |
| 7,855,396 B2* | 12/2010 | Dai | ................ | H01L 25/167 257/100 |
| 8,420,954 B2* | 4/2013 | Lin | ................ | H05K 1/0203 174/15.1 |
| 8,488,320 B2* | 7/2013 | Tseng | ................ | F04D 29/023 165/104.33 |
| 8,558,374 B2* | 10/2013 | Markovich | ......... | H05K 7/1061 257/712 |
| 8,946,904 B2* | 2/2015 | Railkar | ............... | H01L 23/3677 257/668 |
| 2002/0008963 A1* | 1/2002 | DiBene, II | ................ | G06F 1/18 361/720 |
| 2008/0024998 A1* | 1/2008 | Hsu | ..................... | H01L 23/5389 361/719 |
| 2009/0046432 A1* | 2/2009 | Hsu | ..................... | H01L 23/5385 361/717 |
| 2009/0067135 A1* | 3/2009 | Hirai | ................... | H01L 23/3107 361/715 |
| 2009/0180257 A1* | 7/2009 | Park | ....................... | H01L 23/64 361/709 |
| 2009/0294947 A1* | 12/2009 | Tain | .................... | H01L 25/0657 257/686 |
| 2011/0090648 A1* | 4/2011 | Chen | ...................... | H05K 1/181 361/707 |
| 2012/0268896 A1* | 10/2012 | Huang | ................. | H05K 1/0203 361/720 |
| 2012/0314369 A1* | 12/2012 | Wu | ........................ | H01L 23/427 361/701 |
| 2014/0133105 A1* | 5/2014 | Yee | ..................... | H05K 7/20509 361/720 |
| 2014/0293547 A1* | 10/2014 | Kung | ................... | H05K 3/0026 361/715 |
| 2014/0362536 A1* | 12/2014 | Mishra | ................ | H01L 21/8252 361/710 |
| 2015/0129190 A1* | 5/2015 | Lin | ...................... | H01L 23/3677 165/185 |
| 2015/0200337 A1* | 7/2015 | Denda | .................... | H05K 1/021 257/99 |
| 2016/0027715 A1* | 1/2016 | Watanabe | ........... | H01L 23/3675 361/719 |
| 2016/0050744 A1* | 2/2016 | Lee | ....................... | H05K 1/0206 361/712 |
| 2017/0213821 A1* | 7/2017 | Or-Bach | ............ | H01L 27/0688 |

FOREIGN PATENT DOCUMENTS

| | | |
|---|---|---|
| TW | 201525664 | 7/2015 |
| TW | 201618631 | 5/2016 |

* cited by examiner

PACKAGE STRUCTURE AND MANUFACTURING METHOD THEREOF

CROSS-REFERENCE TO RELATED APPLICATION

This application claims the priority benefit of Taiwan application serial no. 105132525, filed on Oct. 7, 2016. The entirety of the above-mentioned patent application is hereby incorporated by reference herein and made a part of this specification.

BACKGROUND OF THE INVENTION

Field of the Invention

The invention relates to a package structure and a manufacturing method thereof, and more particularly, to a package structure having heat dissipation function and a manufacturing method thereof.

Description of Related Art

With the rapid development of the technology industry, the electronic devices in an electronic product are developed to have high performance, high speed, and multi-functionality. However, the electronic devices produce a large amount of thermal energy during operation, and therefore how to integrate a heat dissipation module design in an electronic apparatus to reduce working heat produced by the electronic devices has become an important issue.

In the current package structure, a piezoelectric material is attached to the inside of a metal cover, and the metal cover is disposed on a package carrier and define a body chamber with the package carrier, and the electronic devices are disposed on the outermost surface of the package carrier and located in the body chamber. The working heat produced by the electronic devices is reduced by the change in size of the body chamber via the repeated stretching and contraction of the piezoelectric material itself. However, the metal cover to which a piezoelectric material is attached is disposed on the package carrier, and therefore the size and the thickness of the overall package structure cannot be reduced, such that the current need for a thinner product cannot be met. Moreover, the electronic devices are all disposed on the package carrier with the active surfaces facing the piezoelectric material (same direction). As a result, electromagnetic interference is readily generated between the electronic devices, and the operational quality of the electronic devices is affected as a result.

SUMMARY OF THE INVENTION

The invention provides a package structure in which the active surfaces of two adjacent electronic devices respectively face opposite directions, and piezoelectric heat dissipation units are disposed in the openings of a build-up circuit structure, such that the known issue of electromagnetic interference produced between the electronic devices can be effectively solved and a smaller package thickness and size can be achieved to meet the current needs of a thinner product.

The invention further provides a manufacturing method of a package structure for manufacturing the package structure above.

The package structure of the invention includes a circuit substrate, a first build-up circuit structure, a second build-up circuit structure, and a plurality of piezoelectric heat dissipation units. The circuit substrate includes a core layer, a plurality of electronic devices, and a conducting unit. The core layer has a first surface and a second surface opposite to each other. The electronic devices are embedded in the core layer, wherein each of the electronic devices has an active surface and a back surface opposite to each other, and the active surfaces of two adjacent electronic devices respectively face the first surface and the second surface of the core layer. The conducting unit is disposed on the first surface and the second surface of the core layer and extended to the electronic devices and electrically connected to the electronic devices. The first build-up circuit structure is disposed on the first surface of the core layer and has at least one first opening. The second build-up circuit structure is disposed on the second surface of the core layer and has at least one second opening, wherein the first opening and the second opening expose a portion of the conducting unit. The piezoelectric heat dissipation units are disposed on the conducting unit exposed by the first opening and the second opening and respectively correspond to the active surfaces of the electronic devices, wherein the piezoelectric heat dissipation units are electrically connected to the conducting unit exposed by the first opening and the second opening.

In an embodiment of the invention, the core layer includes a dielectric layer and an insulating layer. The dielectric layer has an upper surface and a lower surface opposite to each other and a plurality of holes. The electronic devices are respectively disposed in the holes. The insulating layer covers the upper surface and the lower surface of the dielectric layer and is filled in the holes to cover the electronic devices.

In an embodiment of the invention, the conducting unit includes: a plurality of through-holes, a plurality of first pads, a plurality of second pads, and a plurality of third pads. The through-holes are extended from the first surface and the second surface of the core layer to the electronic devices and electrically connected to the electronic devices. The first pads are disposed on the first surface and the second surface of the core layer, wherein the first pads are electrically connected to the active surfaces of the electronic devices via a portion of the through-holes. The second pads are disposed on the first surface and the second surface of the core layer and surround the first pads. The third pads are disposed on the first surface and the second surface of the core layer, wherein the third pads are electrically connected to the back surfaces of the electronic devices via another portion of the through-holes.

In an embodiment of the invention, the first opening and the second opening expose the first pads and the second pads and the piezoelectric heat dissipation units are electrically connected to the first pads.

In an embodiment of the invention, each of the piezoelectric heat dissipation units includes an elastic sheet, a piezoelectric block, a first adhesive layer, a buffer layer, a second adhesive layer, and two electrode wires. The piezoelectric block is disposed on the elastic sheet. The first adhesive layer is disposed on the piezoelectric block. The buffer layer is disposed on the first adhesive layer. The second adhesive layer is disposed on the buffer layer. The electrode wires are embedded in the second adhesive layer, the buffer layer, and the first adhesive layer, wherein each of the electrode wires has a first end and a second end opposite to each other, the first end is embedded in a surface of the second adhesive layer relatively far from the buffer layer and in direct contact with one of the first pads, and the second end is in direct contact with the piezoelectric block.

In an embodiment of the invention, the first build-up circuit structure includes a first dielectric layer and a plurality of first through-holes. The first conductive vias pass through the first dielectric layer and are extended and disposed on the top surface of the first dielectric layer. The first conductive vias are at least electrically connected to the third pads.

In an embodiment of the invention, the second build-up circuit structure includes a second dielectric layer and a plurality of second conductive vias. The second conductive vias pass through the second dielectric layer and are extended and disposed on the bottom surface of the second dielectric layer. The second conductive vias are at least electrically connected to the third pads.

In an embodiment of the invention, the circuit substrate further includes: a plurality of conductive columns passing through the core layer and extended and disposed on the first surface and the second surface of the core layer.

In an embodiment of the invention, the package structure further includes: a third build-up circuit structure and a fourth build-up circuit structure. The third build-up circuit structure covers the first build-up circuit structure and has a plurality of first heat dissipation holes, wherein the first heat dissipation holes are disposed corresponding to the first opening. The fourth build-up circuit structure covers the second build-up circuit structure and has a plurality of second heat dissipation holes, wherein the second heat dissipation holes are disposed corresponding to the second opening.

In an embodiment of the invention, the fourth build-up circuit structure includes a build-up dielectric layer and a plurality of build-up conductive vias. The build-up dielectric layer covers the second build-up circuit structure, the build-up conductive vias pass through the build-up dielectric layer and are extended and disposed on the outer surface of the build-up dielectric layer, and the build-up conductive vias are at least electrically connected to the second conductive vias.

The manufacturing method of the package structure of the invention includes the following steps. A circuit substrate is provided, and the circuit substrate includes a core layer, a plurality of electronic devices, and a conducting unit. The core layer has a first surface and a second surface opposite to each other. The electronic devices are embedded in the core layer, wherein each of the electronic devices has an active surface and a back surface opposite to each other, and the active surfaces of two adjacent electronic devices respectively face the first surface and the second surface of the core layer. The conducting unit is disposed on the first surface and the second surface of the core layer and extended to the electronic devices and electrically connected to the electronic devices. A first build-up circuit structure and a second build-up circuit structure are respectively formed on the first surface and the second surface of the core layer, wherein at least one first opening and at least one second opening are respectively formed in the first build-up circuit structure and the second build-up circuit structure, and the first opening and the second opening respectively expose a portion of the conducting unit. A plurality of piezoelectric heat dissipation units is disposed on the conducting unit exposed by the first opening and the second opening, wherein the piezoelectric heat dissipation units respectively correspond to the active surfaces of the electronic devices, and the piezoelectric heat dissipation units are electrically connected to the conducting unit exposed by the first opening and the second opening.

In an embodiment of the invention, the step of providing a circuit substrate includes: providing a dielectric layer, wherein the dielectric layer has an upper surface and a lower surface opposite to each other and a plurality of holes. The electronic devices are disposed in the holes of the dielectric layer. An insulating layer is formed on the dielectric layer, wherein the insulating layer covers the upper surface and the lower surface of the dielectric layer and is filled in the holes to cover the electronic devices. A plurality of through-holes extended from the first surface and the second surface of the core layer to the electronic devices is formed, wherein the through-holes are electrically connected to the electronic devices. A plurality of first pads is forming on the first surface and the second surface of the core layer, wherein the first pads are electrically connected to the active surfaces of the electronic devices via a portion of the through-holes. A plurality of second pads is formed on the first surface and the second surface of the core layer and surrounds the first pads. A plurality of third pads is formed on the first surface and the second surface of the core layer, wherein the third pads are electrically connected to the back surfaces of the electronic devices via another portion of the through-holes, and the through-holes, the first pads, the second pads, and the third pads define the conducting unit.

In an embodiment of the invention, the manufacturing method of the package structure further includes: attaching a plurality of release films on the first pads and the second pads before the first build-up circuit structure and the second build-up circuit structure are formed on the first surface and the second surface of the core layer. The release films are removed after the first opening and the second opening of the first build-up circuit structure and the second build-up circuit structure are formed to expose the first pads and the second pads.

In an embodiment of the invention, the first build-up circuit structure includes a first dielectric layer and a plurality of first through-holes. The first conductive vias pass through the first dielectric layer and are extended and disposed on the top surface of the first dielectric layer. The first conductive vias are at least electrically connected to the third pads.

In an embodiment of the invention, the second build-up circuit structure includes a second dielectric layer and a plurality of second conductive vias. The second conductive vias pass through the second dielectric layer and are extended and disposed on the bottom surface of the second dielectric layer. The second conductive vias are at least electrically connected to the third pads.

In an embodiment of the invention, each of the piezoelectric heat dissipation units includes an elastic sheet, a piezoelectric block, a first adhesive layer, a buffer layer, a second adhesive layer, and two electrode wires. The piezoelectric block is disposed on the elastic sheet. The first adhesive layer is disposed on the piezoelectric block. The buffer layer is disposed on the first adhesive layer. The second adhesive layer is disposed on the buffer layer. The electrode wires are embedded in the second adhesive layer, the buffer layer, and the first adhesive layer, wherein each of the electrode wires has a first end and a second end opposite to each other, the first end is embedded in a surface of the second adhesive layer relatively far from the buffer layer and in direct contact with one of the first pads, and the second end is in direct contact with the piezoelectric block.

In an embodiment of the invention, the step of providing the circuit substrate further includes: forming a plurality of conductive columns passing through the core layer and extended and disposed on the first surface and the second surface of the core layer.

In an embodiment of the invention, the method further includes, after the piezoelectric heat dissipation units are disposed on the conducting unit exposed by the first opening and the second opening: forming a third build-up circuit structure on the first build-up circuit structure, wherein the third build-up circuit structure covers the first build-up circuit structure and has a plurality of first heat dissipation holes, and the first heat dissipation holes are disposed corresponding to the first opening. A fourth build-up circuit structure is formed on the second build-up circuit structure, wherein the fourth build-up circuit structure covers the second build-up circuit structure and has a plurality of second heat dissipation holes, and the second heat dissipation holes are disposed corresponding to the second opening.

In an embodiment of the invention, the fourth build-up circuit structure includes a build-up dielectric layer and a plurality of build-up conductive vias. The build-up dielectric layer covers the second build-up circuit structure, the build-up conductive vias pass through the build-up dielectric layer and are extended and disposed on the outer surface of the build-up dielectric layer, and the build-up conductive vias are at least electrically connected to the second conductive vias.

In an embodiment of the invention, the method further includes, after the fourth build-up circuit structure is formed: forming a plurality of solder balls on the conductive vias extended and disposed on the outer surface of the build-up dielectric layer.

Based on the above, in the design of the package structure of the invention, the electronic devices are embedded in the core layer, and the active surfaces of two adjacent electronic devices respectively face opposite directions, and the piezoelectric heat dissipation units are disposed in the openings of the build-up circuit structure and correspond to the active surfaces of the electronic devices. In comparison to the known package structure in which the electronic devices are disposed on the outermost surface of the package carrier and the size of the body chamber is changed via the piezoelectric material attached to the metal cover for heat dissipation, in addition to preventing electromagnetic interference between the electronic devices, the package structure of the invention can also have a smaller package thickness and size to meet the needs of a thinner package structure.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to FIG. 3H illustrate cross-sectional schematic diagrams of a manufacturing method of a package structure of an embodiment of the invention.

DESCRIPTION OF THE EMBODIMENTS

Figure 1:
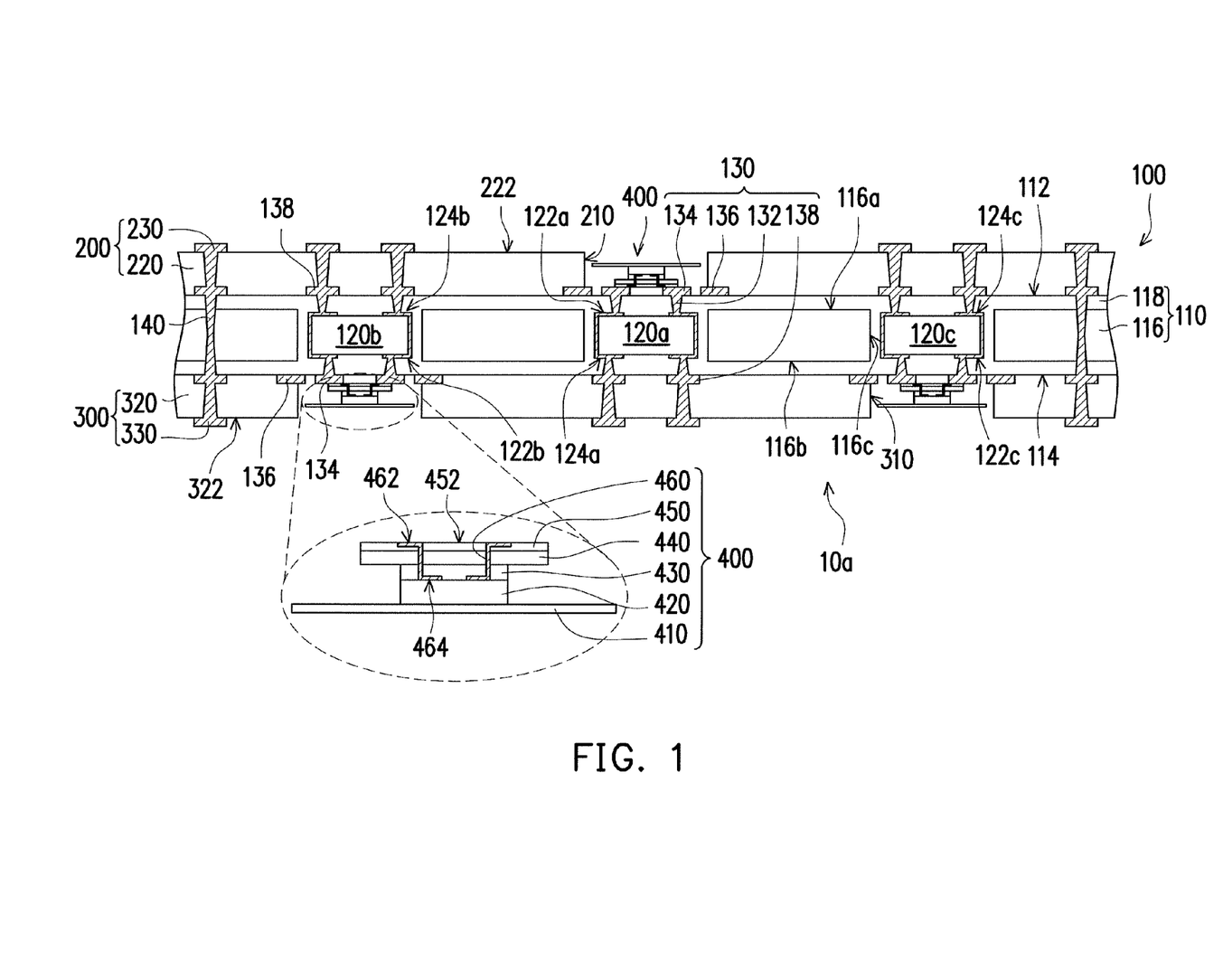
FIG. 1 shows a cross-sectional schematic diagram of a package structure of an embodiment of the invention.

FIG. 1 shows a cross-sectional schematic diagram of a package structure of an embodiment of the invention. Referring to FIG. 1, in the present embodiment, a package structure 10a includes a circuit substrate 100, a first build-up circuit structure 200, a second build-up circuit structure 300, and a plurality of piezoelectric heat dissipation units 400. The circuit substrate 100 includes a core layer 110, a plurality of electronic devices (three electronic devices 120a, 120b, and 120c are schematically shown in FIG. 1), and a conducting unit 130. The core layer 110 has a first surface 112 and a second surface 114 opposite to each other. The electronic devices 120a, 120b, and 120c are embedded in the core layer 110, wherein the electronic device 120a (or 120b or 120c) has an active surface 122a (or 122b or 122c) and a back surface 124a (or 124b or 124c) opposite to each other, and the active surfaces 122a and 122b (or 122a and 122c) of two adjacent electronic devices 120a and 120b (or 120a and 120c) respectively face the first surface 112 and the second surface 114 of the core layer 110. The conducting unit 130 is disposed on the first surface 112 and the second surface 114 of the core layer 110 and extended to the electronic devices 120a, 120b, and 120c and electrically connected to the electronic devices 120a, 120b, and 120c.

The first build-up circuit structure 200 is disposed on the first surface 112 of the core layer 110 and has at least one first opening 210. The second build-up circuit structure 300 is disposed on the second surface 114 of the core layer 110 and has at least one second opening 310, wherein the first opening 210 and the second opening 310 expose a portion of the conducting unit 130. The piezoelectric heat dissipation units 400 are disposed on the conducting unit 130 exposed by the first opening 210 and the second opening 310 and respectively correspond to the active surfaces 122a, 122b, and 122c of the electronic devices 120a, 120b, and 120c, wherein the piezoelectric heat dissipation units 400 are electrically connected to the conducting unit 130 exposed by the first opening 210 and the second opening 310.

Specifically, the core layer 110 of the circuit substrate 100 of the present embodiment includes a dielectric layer 116 and an insulating layer 118. The dielectric layer 116 has an upper surface 116a and a lower surface 116b opposite to each other and a plurality of holes 116c. The electronic devices 120a, 120b, and 120c are respectively disposed in the holes 116c. The insulating layer 118 covers the upper surface 116a and the lower surface 116b of the dielectric layer 116 and is filled in the holes 116c to cover the electronic devices 120a, 120b, and 120c. Here, the electronic devices 120a, 120b, and 120c can be, for instance, radio frequency devices, active devices, passive devices, memories, or electronic connectors, and are not particularly limited.

In the present embodiment, the active surfaces 122a and 122b (or 122a and 122c) of two adjacent electronic devices 120a and 120b (or 120a and 120c) respectively face the first surface 112 and the second surface 114 of the core layer 110 (i.e., opposite directions). Therefore, the electronic devices 120a, 120b, and 120c can operate independently, and electromagnetic interference between the electronic devices can be prevented, such that better work efficiency is achieved.

Referring further to FIG. 1, the conducting unit 130 of the present embodiment is embodied to include a plurality of through-holes 132, a plurality of first pads 134, a plurality of second pads 136, and a plurality of third pads 138. The through-holes 132 are extended from the first surface 112 and the second surface 114 of the core layer 110 to the electronic devices 120a, 120b, and 120c and electrically connected to the electronic devices 120a, 120b, and 120c. The first pads 134 are disposed on the first surface 112 and the second surface 114 of the core layer 110, wherein the first pads 134 are electrically connected to the active surfaces 122a, 122b, and 122c of the electronic devices 120a, 120b, and 120c via a portion of the through-holes 132. The second pads 136 are disposed on the first surface 112 and the second surface 114 of the core layer 110 and surround the first pads 134. The third pads 138 are disposed on the first surface 112 and the second surface 114 of the core layer 110, wherein the third pads 138 are electrically connected to the back surfaces 124a, 124b, and 124c of the electronic devices 120a, 120b, and 120c via another portion of the through-holes 132. Moreover, the circuit substrate 100 of the present embodiment further includes a plurality of conductive columns 140 passing through the core layer 110 and extended and disposed on the first surface 112 and the second surface 114 of the core layer 110.

Moreover, as shown in FIG. 1, the first build-up circuit structure 200 of the present embodiment includes a first dielectric layer 220 and a plurality of first conductive vias 230. The first conductive vias 230 pass through the first dielectric layer 220 and are extended and disposed on a top surface 222 of the first dielectric layer 220. The first conductive vias 230 are at least electrically connected to the third pads 138. Moreover, the second build-up circuit structure 300 includes a second dielectric layer 320 and a plurality of second conductive vias 330. The second conductive vias 330 pass through the second dielectric layer 320 and are extended and disposed on a bottom surface 322 of the second dielectric layer 320. The second conductive vias 330 are at least electrically connected to the third pads 138. Moreover, the first conductive vias 230 and the second conductive vias 330 are electrically connected to the third pads 138 and the conductive columns 140. In particular, the first opening 210 and the second opening 310 of the first build-up circuit structure 200 and the second build-up circuit structure 300 expose the first pads 134 and the second pads 136, and the piezoelectric heat dissipation units 400 are electrically connected to the first pads 134.

Specifically, each of the piezoelectric heat dissipation units 400 of the present embodiment includes an elastic sheet 410, a piezoelectric block 420, a first adhesive layer 430, a buffer layer 440, a second adhesive layer 450, and two electrode wires 460. The material of the elastic sheet 410 is, for instance, metal, plastic, or other elastic materials, and is not particularly limited. The piezoelectric block 420 is disposed on the elastic sheet 410, wherein the elastic sheet 410 can be directly connected to the piezoelectric block 420 via attachment. The piezoelectric block 420 has advantages such as low power consumption, quiet, small size, fast reaction, limited heat generation, good precision, high conversion efficiency, and good controllability. The piezoelectric block 420 is deformed by the self-generated repeated stretching and contraction via the inverse piezoelectric effect (electrical energy-to-mechanical energy) of the piezoelectric block 420 such that the elastic sheet 410 disposed on the piezoelectric block 420 can bob up and down and thermal energy produced during the operation of the electronic devices 120a, 120b, and 120c can be directly discharged in an effective manner. The first adhesive layer 430 is disposed on the piezoelectric block 420, the buffer layer 440 is disposed on the first adhesive layer 430, and the second adhesive layer 450 is disposed on the buffer layer 440. The object of the buffer layer 440 is to absorb stress, and the object of the first adhesive layer 430 and the second adhesive layer 450 is to fix the buffer layer 440 on the piezoelectric block 420. The electrode wires 460 are embedded in the second adhesive layer 450, the buffer layer 440, and the first adhesive layer 430, wherein each of the electrode wires 460 has a first end 462 and a second end 464 opposite to each other, the first end 462 is embedded in a surface 452 of the second adhesive layer 450 relatively far from the buffer layer 440 and in direct contact with one of the first pads 134, and the second end 464 is in direct contact with the piezoelectric block 420.

The active surfaces 122a and 122b (or 122a and 122c) of two adjacent electronic devices 120a and 120b (or 120a and 120c) of the present embodiment respectively face the first surface 112 and the second surface 114 of the core layer 110 (i.e., opposite directions), and the piezoelectric heat dissipation units 400 are located in the first opening 210 and the second opening 310 of the first build-up circuit structure 200 and the second build-up circuit structure 300 and correspond to the active surfaces 122a, 122b, and 122c of the electronic devices 120a, 120b, and 120c. Therefore, the uniformity of stress distribution during the disposition of the electronic devices 120a, 120b, and 120c and the piezoelectric heat dissipation units 400 can be improved, and the yield and reliability of the package structure 10a can be increased. Moreover, in comparison to the known package structure in which the electronic devices are disposed on the outermost surface of the package carrier and the size of the body chamber is changed via the piezoelectric material attached to the metal cover for heat dissipation, the package structure 10a of the present embodiment can have a smaller package thickness and size to meet the needs of a thinner package structure.

It should be mentioned here that, the following embodiments adopt the reference numerals of the embodiments above and a portion of the contents thereof, wherein the same reference numerals are used to represent the same or similar devices and descriptions of the same technical contents are omitted. The omitted portions are as described in the embodiments above and are not repeated in the embodiments below.

Figure 2:
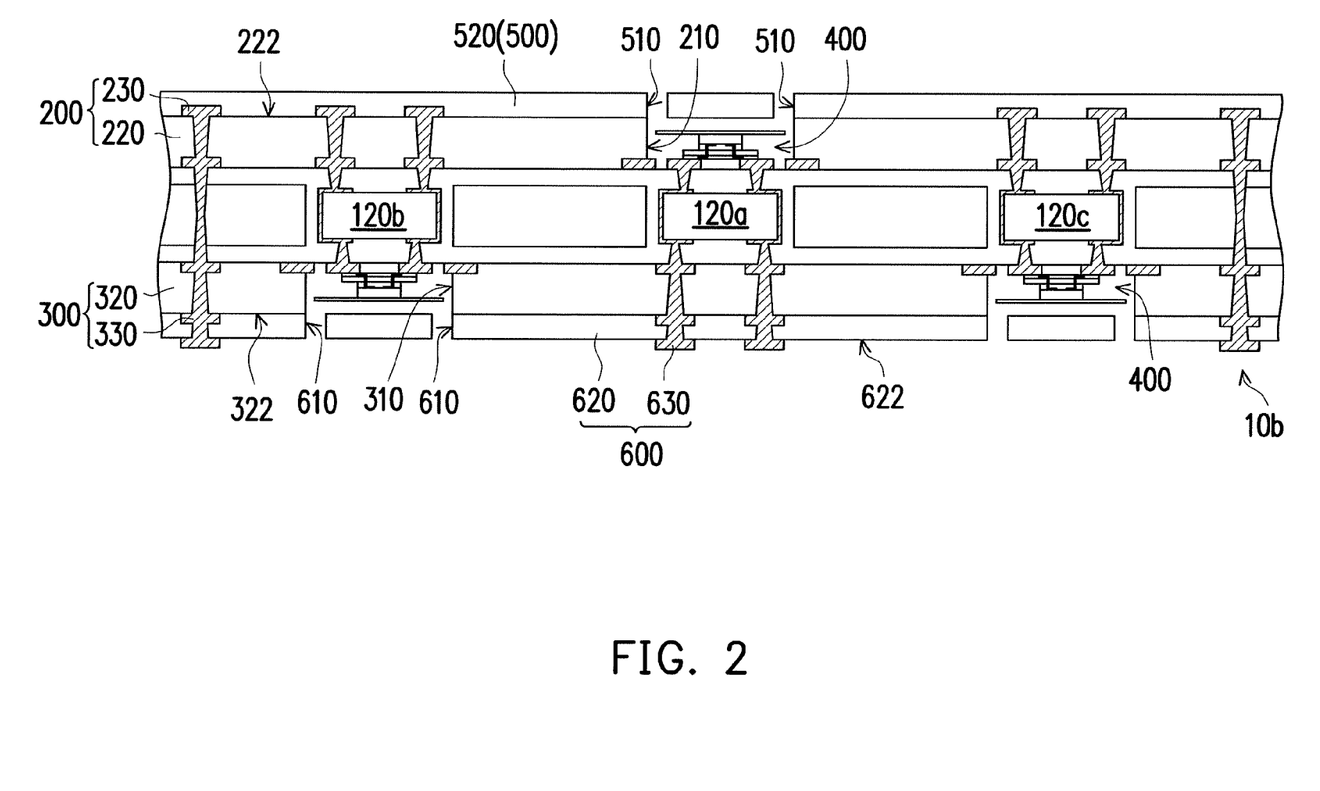
FIG. 2 shows a cross-sectional schematic diagram of a package structure of another embodiment of the invention.

FIG. 2 shows a cross-sectional schematic diagram of a package structure of another embodiment of the invention. Referring first to FIG. 2, a package structure 10b of the present embodiment is similar to the package structure 10a of FIG. 1, and the main difference between the two is: the package structure 10b of the present embodiment further includes a third build-up circuit structure 500 and a fourth build-up circuit structure 600. The third build-up circuit structure 500 covers the first build-up circuit structure 200 and has a plurality of first heat dissipation holes 510, wherein the first heat dissipation holes 510 are disposed corresponding to the first opening 210. The fourth build-up circuit structure 600 covers the second build-up circuit structure 300 and has a plurality of second heat dissipation holes 610, wherein the second heat dissipation holes 610 are disposed corresponding to the second opening 310.

Specifically, the third build-up circuit structure 500 of the present embodiment includes a build-up protective layer 520 covering the first dielectric layer 220 of the first build-up circuit structure 200, the first conductive vias 230, and the piezoelectric heat dissipation units 400 located above the electronic device 120*a*. As a result, the piezoelectric heat dissipation units 400 can be effectively protected. The first heat dissipation holes 510 of the third build-up circuit structure 500 are disposed corresponding to the first opening 210 of the first build-up circuit structure 200, such that the thermal energy produced by the electronic devices 120*a*, 120*b*, and 120*c* is discharged outside the package structure 10*b* from the first heat dissipation holes 510. Moreover, the fourth build-up circuit structure 600 includes a build-up dielectric layer 620 and a plurality of build-up conductive vias 630. The build-up dielectric layer 620 covers the second dielectric layer 320 of the second build-up circuit structure 300, the second conductive vias 330, and the piezoelectric heat dissipation units 400 located below the electronic devices 120*b* and 120*c*. As a result, the piezoelectric heat dissipation units 400 can be effectively protected. The build-up conductive vias 630 pass through the build-up dielectric layer 620 and are extended and disposed on an outer surface 622 of the build-up dielectric layer 620, and the build-up conductive vias 630 are at least electrically connected to the second conductive vias 330.

In short, the main object of disposing the third build-up circuit structure 500 and the fourth build-up circuit structure 600 in the package structure 10*b* of the present embodiment is to protect the piezoelectric heat dissipation units 400 disposed in the first opening 210 and the second opening 310 of the first build-up circuit structure 200 and the second build-up circuit structure 300.

In the following, two embodiments are provided to respectively describe the manufacturing method of the package structures 10*a* and 10*b*, and the manufacturing method of the package structures 10*a* and 10*b* is described in detail with reference to FIG. 3A to FIG. 3J and FIG. 4A and FIG. 4B.

Figure 3A:
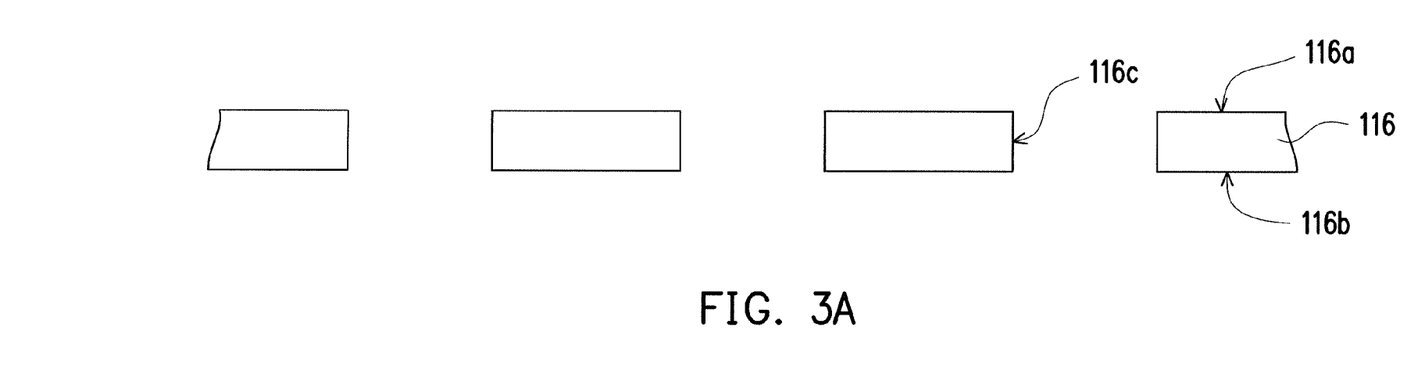
Figure 3B:
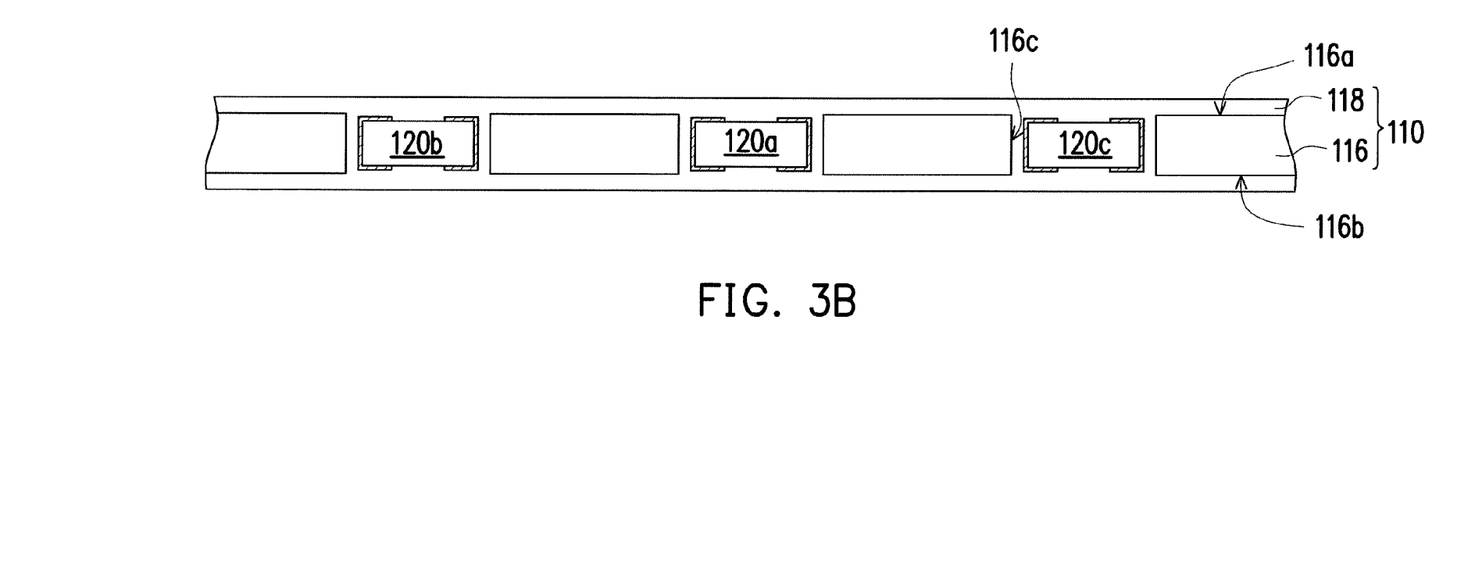
Figure 3C:
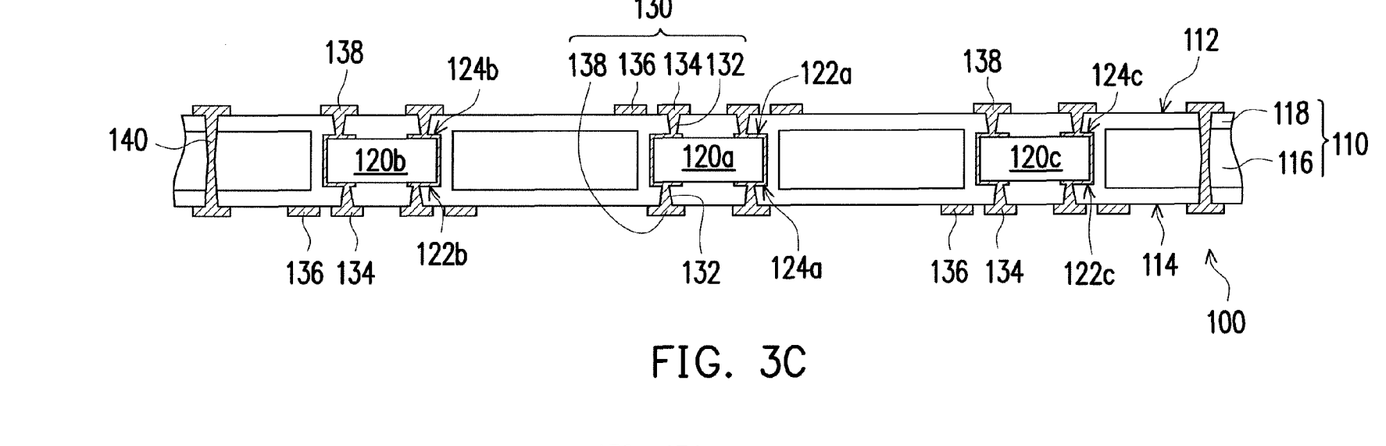
Figure 3D:
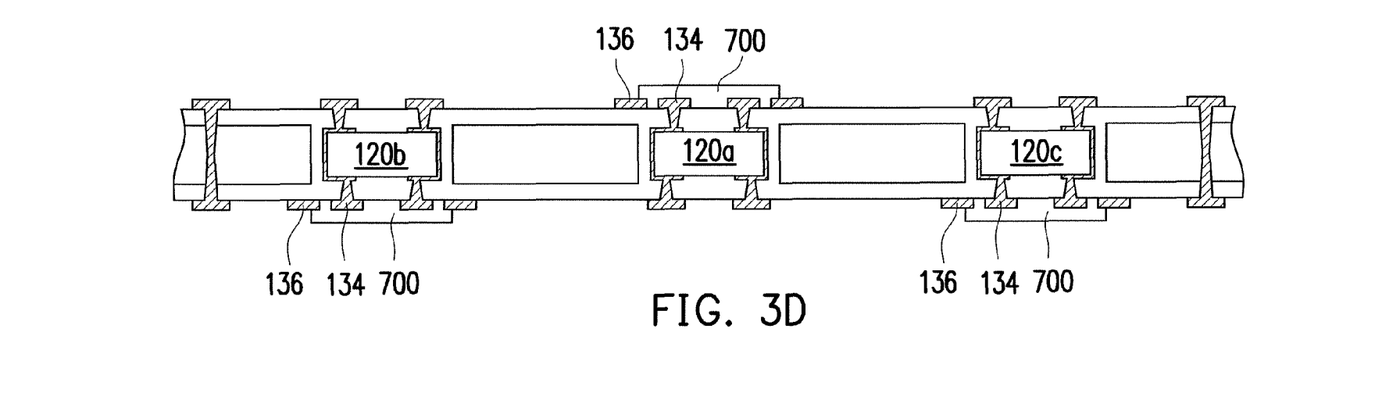
Figure 3E:
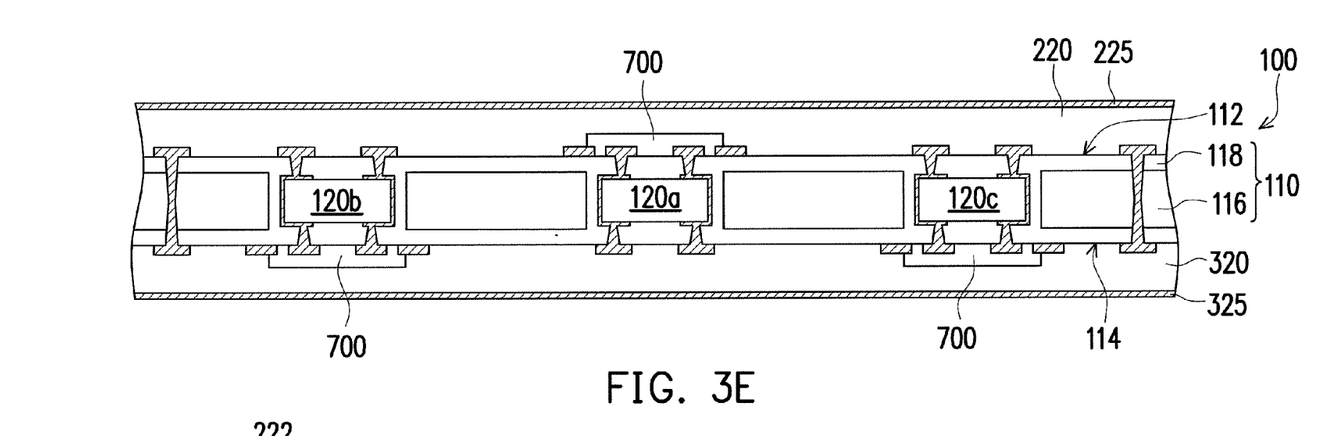
Figure 3F:
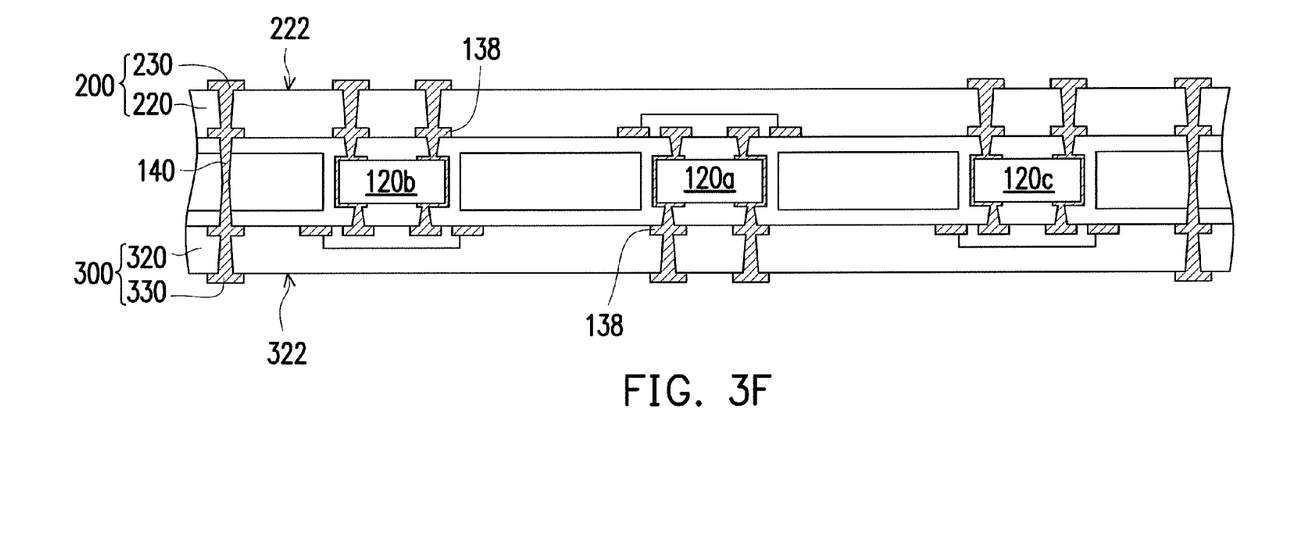
Figure 3G:
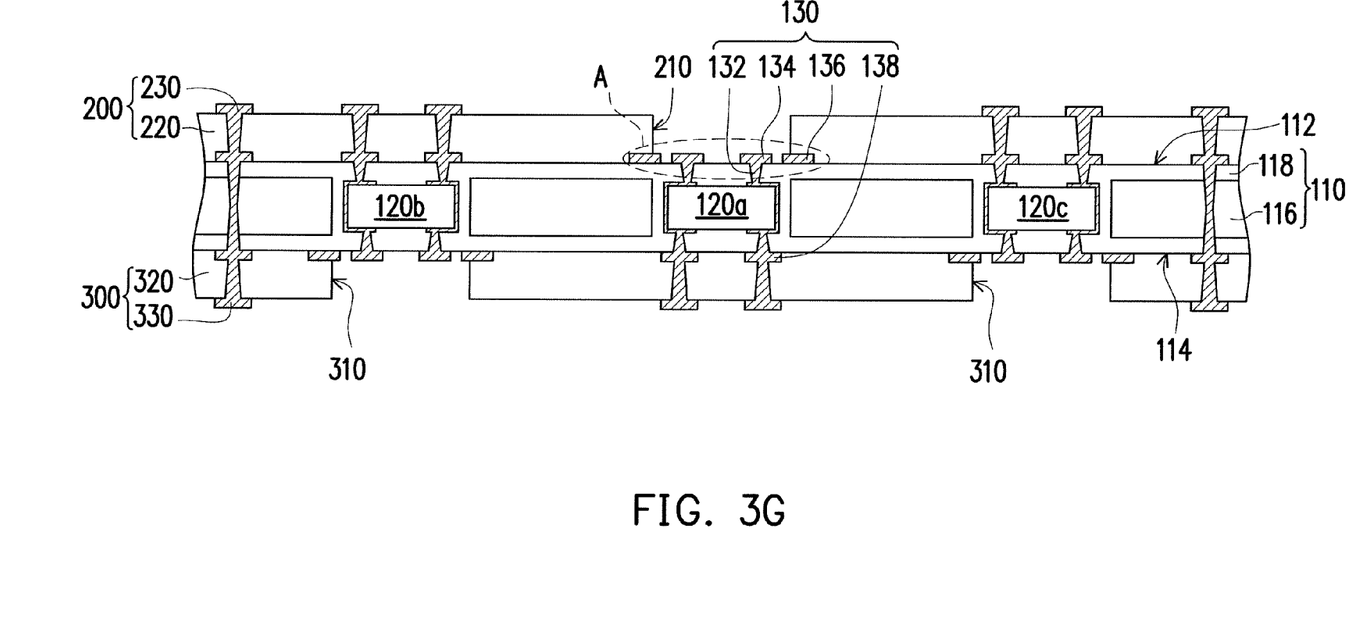
Figure 3H:
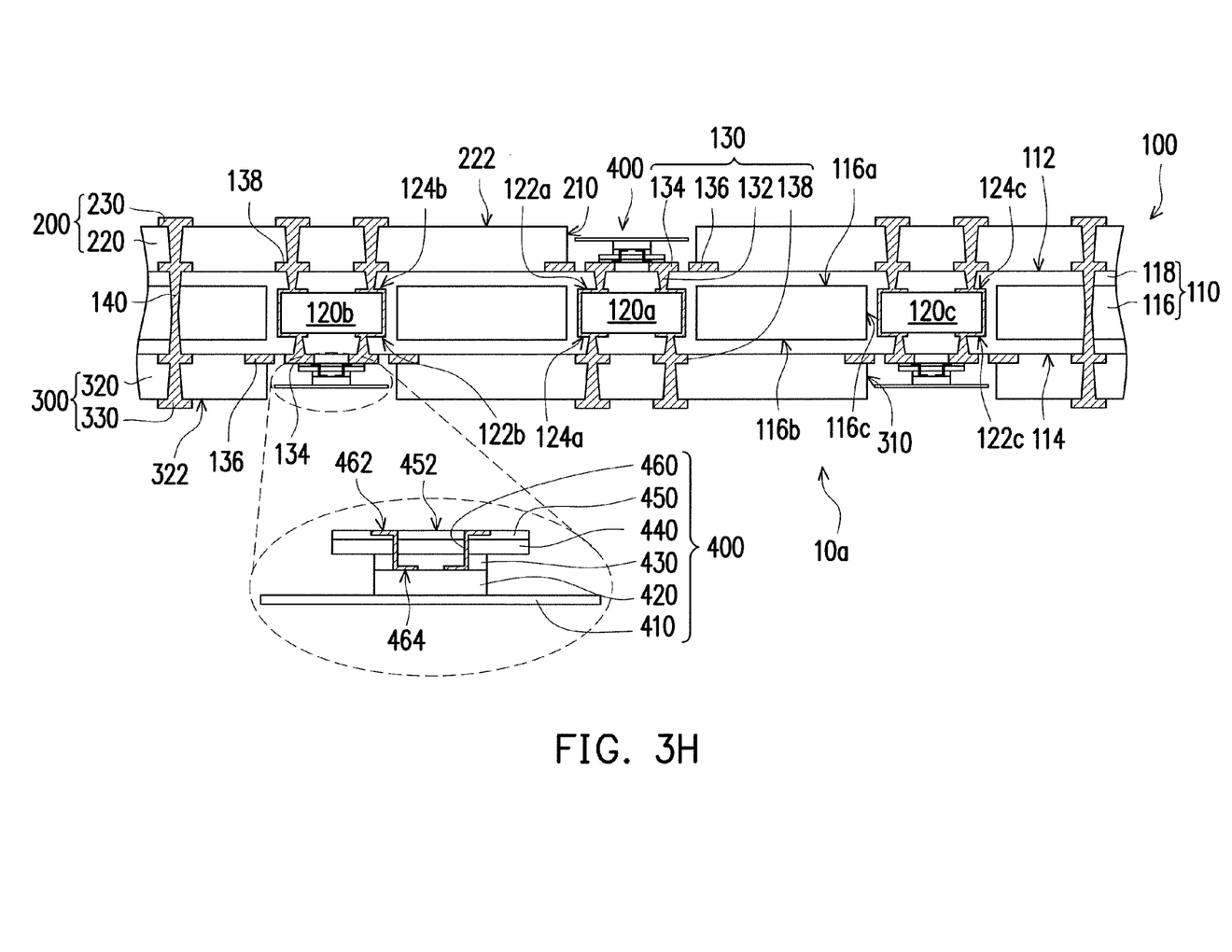
Figure 3I:
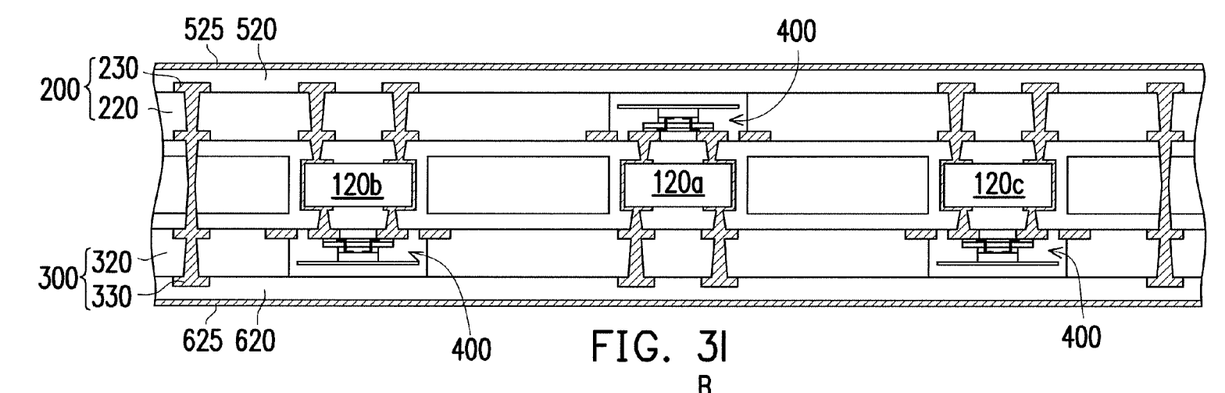
FIG. 3I and FIG. 3J show cross-sectional schematic diagrams of some of the steps of the manufacturing method of a package structure of another embodiment of the invention.
Figure 3J:
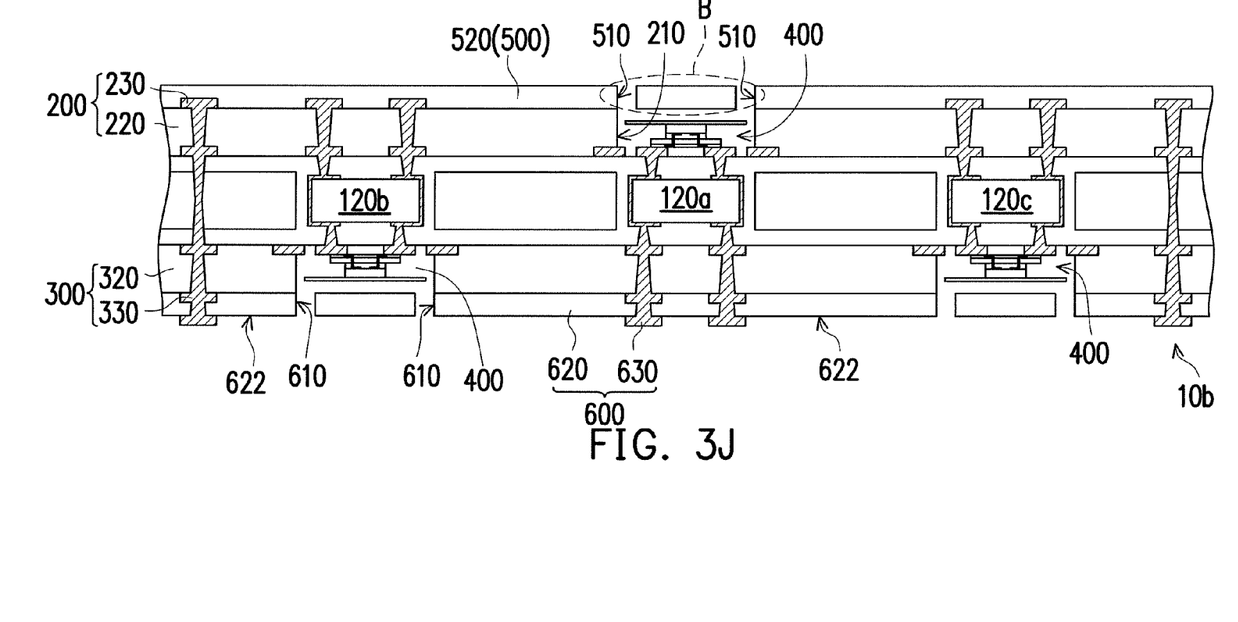
Figure 4A:
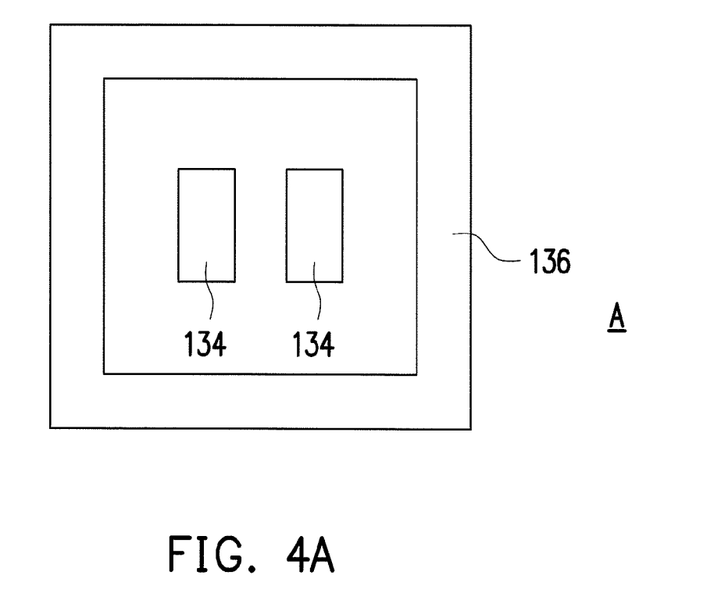
FIG. 4A is a top view of region A in FIG. 3G.
Figure 4B:
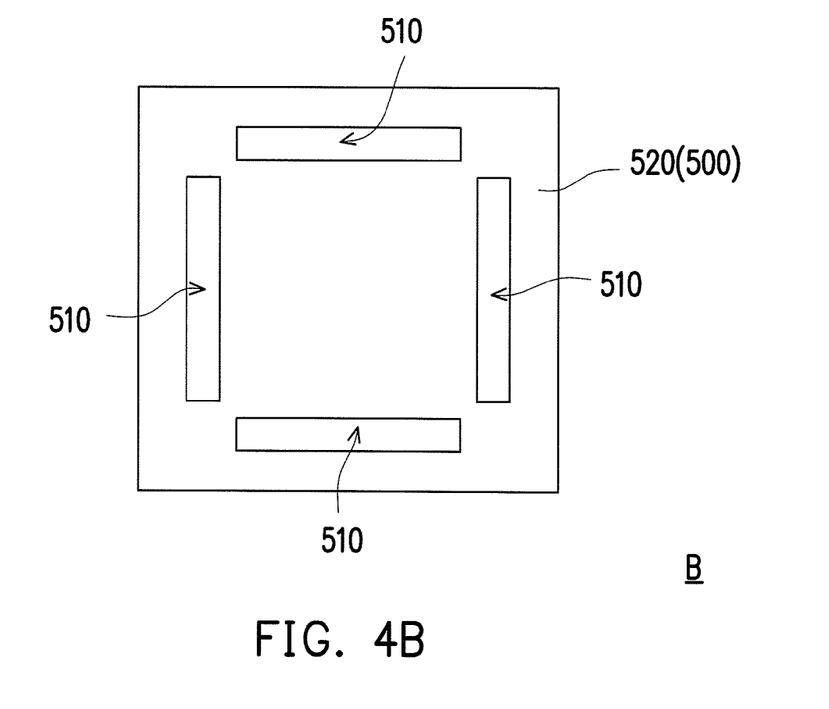
FIG. 4B is a top view of region B in FIG. 3J.

FIG. 3I and FIG. 3J show cross-sectional schematic diagrams of some of the steps of the manufacturing method of a package structure of another embodiment of the invention. FIG. 4A is a top view of region A in FIG. 3G. FIG. 4B is a top view of region B in FIG. 3J. Referring first to FIG. 3C, according to the manufacturing method of the package structure 10*a* of the present embodiment, first, a circuit substrate 100 is provided, wherein the circuit substrate 100 includes a core layer 110, electronic devices 120*a*, 120*b*, and 120*c*, and a conducting unit 130. The core layer 110 has a first surface 112 and a second surface 114 opposite to each other. The electronic devices 120*a*, 120*b*, and 120*c* are embedded in the core layer 110, wherein the electronic devices 120*a*, 120*b*, and 120*c* have active surfaces 122*a*, 122*b*, and 122*c* and back surfaces 124*a*, 124*b*, and 124*c* opposite to one another, and the active surfaces 122*a* and 122*b* (or 122*a* and 122*c*) of two adjacent electronic devices 120*a* and 120*b* (or 120*a* and 120*c*) respectively face the first surface 112 and the second surface 114 of the core layer 110. The conducting unit 130 is disposed on the first surface 112 and the second surface 114 of the core layer 110 and extended to the electronic devices 120*a*, 120*b*, and 120*c* and electrically connected to the electronic devices 120*a*, 120*b*, and 120*c*.

Specifically, the step of providing the circuit substrate 100 includes: referring to FIG. 3A, providing a dielectric layer 116, wherein the dielectric layer 116 has an upper surface 116*a* and a lower surface 116*b* opposite to each other and a plurality of holes 116*c*. Here, the material of the dielectric layer 116 is, for instance, polypropylene (PP), but is not limited thereto.

Next, referring to FIG. 3B, the electronic devices 120*a*, 120*b*, and 120*c* are disposed in the holes 116*c* of the dielectric layer 116, wherein the electronic devices 120*a*, 120*b*, and 120*c* can be, for instance, radio frequency devices, active devices, passive devices, memories, or electronic connectors, and are not particularly limited.

Next, an insulating layer 118 is formed on the dielectric layer 116, wherein the insulating layer 118 covers the upper surface 116*a* and the lower surface 116*b* of the dielectric layer 116 and is filled in the holes 116*c* to cover the electronic devices 120*a*, 120*b*, and 120*c*. Here, the material of the insulating layer 118 is, for instance, ABF (Ajinomoto build-up film, epoxy resin containing glass particles), but is not limited thereto.

Next, referring to FIG. 3C, a plurality of through-holes 132 extended from the first surface 112 and the second surface 114 of the core layer 110 to the electronic devices 120*a*, 120*b*, and 120*c* is formed, and the through-holes 132 are electrically connected to the electronic devices 120*a*, 120*b*, and 120*c*. A plurality of first pads 134 is formed on the first surface 112 and the second surface 114 of the core layer 110, wherein the first pads 134 are electrically connected to the active surfaces 122*a*, 122*b*, and 122*c* of the electronic devices 120*a*, 120*b*, and 120*c* via a portion of the through-holes 132. A plurality of second pads 136 is formed on the first surface 112 and the second surface 114 of the core layer 110 and surrounds the first pads 134. A plurality of third pads 138 is formed on the first surface 112 and the second surface 114 of the core layer 110, wherein the third pads 138 are electrically connected to the back surfaces 124*a*, 124*b*, and 124*c* of the electronic devices 120*a*, 120*b*, and 120*c* via another portion of the through-holes 132, and the through-holes 132, the first pads 134, the second pads 136, and the third pads 138 define the conducting unit 130. The method of forming the through-holes 132, the first pads 134, the second pads 136, and the third pads 138 includes electric drilling, electroplating, and lithography and etching processes. Moreover, a plurality of conductive columns 140 passing through the core layer 110 and extended and disposed on the first surface 112 and the second surface 114 of the core layer 110 is formed.

Next, referring to FIG. 3D, a plurality of release films 700 is attached to the first pads 134 and the second pads 136. Here, the object of attaching the release films 700 is to fix the positions of the subsequent piezoelectric heat dissipation units 400 (refer to FIG. 3H).

Next, referring first to FIG. 3G, a first build-up circuit structure 200 and a second build-up circuit structure 300 are respectively formed on the first surface 112 and the second surface 114 of the core layer 110, wherein the first opening 210 and the second opening 310 are respectively formed in the first build-up circuit structure 200 and the second build-up circuit structure 300, and the first opening 210 and the second opening 310 respectively expose a portion of the conducting unit 130.

Specifically, referring to FIG. 3E, the step of forming the first build-up circuit structure 200 and the second build-up circuit structure 300 includes laminating the first dielectric layer 220 and the first conductive layer 225 located on the first dielectric layer 220 on the first surface 112 of the core layer 110, and laminating the second dielectric layer 320 and the second conductive layer 325 located on the second dielectric layer 320 on the second surface 114 of the core layer 110. The first dielectric layer 220 and the second dielectric layer 320 cover the circuit substrate 100 and the release films 700.

Next, referring to FIG. 3F, the first conductive vias 230 and the second conductive vias 330 are formed via electric drilling, electroplating, and lithography and etching processes. The first conductive vias 230 pass through the first dielectric layer 220 and are extended and disposed on the top surface 222 of the first dielectric layer 220, wherein the first conductive vias 220 are at least electrically connected to the third pads 138. The second conductive vias 330 pass through the second dielectric layer 320 and are extended and disposed on the bottom surface 322 of the second dielectric layer 320, wherein the second conductive vias 320 are at least electrically connected to the third pads 138. Here, the first conductive vias 230 and the second conductive vias 330 are electrically connected to the third pads 138 and the conductive columns 140.

Next, referring to FIG. 3G, a first opening 210 and a second opening 310 are respectively formed on the first build-up circuit structure 200 and the second build-up circuit structure 300 via a laser drilling method to expose the release films 700. Next, the release films 700 are removed via a peeling method to expose the first pads 134 and the second pads 136. Referring to FIG. 4A, the first pads 134 are embodied to bear the positions of the subsequent piezoelectric heat dissipation units 400 (refer to FIG. 3H) and signal input, and the second pads 136 are embodied as laser-blocking layers.

Lastly, referring to FIG. 3H, the piezoelectric heat dissipation units 400 are disposed on the conducting unit 130 exposed by the first opening 210 and the second opening 310, wherein the piezoelectric heat dissipation units 400 respectively correspond to the active surfaces 122a, 122b, and 122c of the electronic devices 120a, 120b, and 120c, and the piezoelectric heat dissipation units 400 are electrically connected to the conducting unit 130 exposed by the first opening 210 and the second opening 310. Here, the piezoelectric heat dissipation units 400 include an elastic sheet 410, a piezoelectric block 420, a first adhesive layer 430, a buffer layer 440, a second adhesive layer 450, and two electrode wires 460. The piezoelectric block 420 is disposed on the elastic sheet 410, and the first adhesive layer 430 is disposed on the piezoelectric block 420. The buffer layer 440 is disposed on the first adhesive layer 430, and the second adhesive layer 450 is disposed on the buffer layer 440. The electrode wires 460 are embedded in the second adhesive layer 450, the buffer layer 440, and the first adhesive layer 430, wherein each of the electrode wires 460 has a first end 462 and a second end 464 opposite to each other, the first end 462 is embedded in a surface 452 of the second adhesive layer 450 relatively far from the buffer layer 440 and in direct contact with the first pads 134, and the second end 464 is in direct contact with the piezoelectric block 420. At this point, the manufacture of the package structure 10a is complete.

In the manufacture of another package structure 10b, referring first to FIG. 3J, the third build-up circuit structure 500 is formed on the first build-up circuit structure 200 and the fourth build-up circuit structure 600 is formed on the second build-up circuit structure 300. The third build-up circuit structure 500 covers the first build-up circuit structure 200 and has a plurality of first heat dissipation holes 510, wherein the first heat dissipation holes 510 are disposed corresponding to the first opening 210. The fourth build-up circuit structure 600 covers the second build-up circuit structure 300 and has a plurality of second heat dissipation holes 610, wherein the second heat dissipation holes 610 are disposed corresponding to the second opening 310.

Referring to FIG. 3I, the step of forming the third build-up circuit structure 500 and the fourth build-up circuit structure 600 includes: first, the build-up protective layer 520 and the build-up conductive layer 525 located on the build-up protective layer 520 are laminated on the first build-up circuit structure 200, and the build-up dielectric layer 620 and the build-up conductive layer 625 located on the build-up dielectric layer 620 are laminated on the second build-up circuit structure 300. The build-up protective layer 520 covers the first dielectric layer 220 of the first build-up circuit structure 200, the first conductive vias 230, and the piezoelectric heat dissipation units 400 located above the electronic device 120a. The build-up dielectric layer 620 covers the second dielectric layer 320 of the second build-up circuit structure 300, the second conductive vias 330, and the piezoelectric heat dissipation units 400 located above the electronic devices 120b and 120c.

Next, referring to FIG. 3J, the build-up conductive vias 630 are formed via electric drilling, electroplating, and lithography and etching processes, wherein the build-up conductive vias 630 pass through the build-up dielectric layer 620 and are extended and disposed on an outer surface 622 of the build-up dielectric layer 620, and the build-up conductive vias 630 are at least electrically connected to the second conductive vias 320. Lastly, the first heat dissipation holes 510 and the second heat dissipation holes 620 are formed in the build-up protective layer 520 and the build-up dielectric layer 620 of the third build-up circuit structure 500 and the fourth build-up circuit structure 600 in a laser drilling method such that the thermal energy produced by the electronic devices 120a, 120b, and 120c can be discharged outside the first opening 210 and the second opening 310 via the first heat dissipation holes 510 and the second heat dissipation holes 620. At this point, the manufacture of the package structure 10b is complete.

Figure 3K:
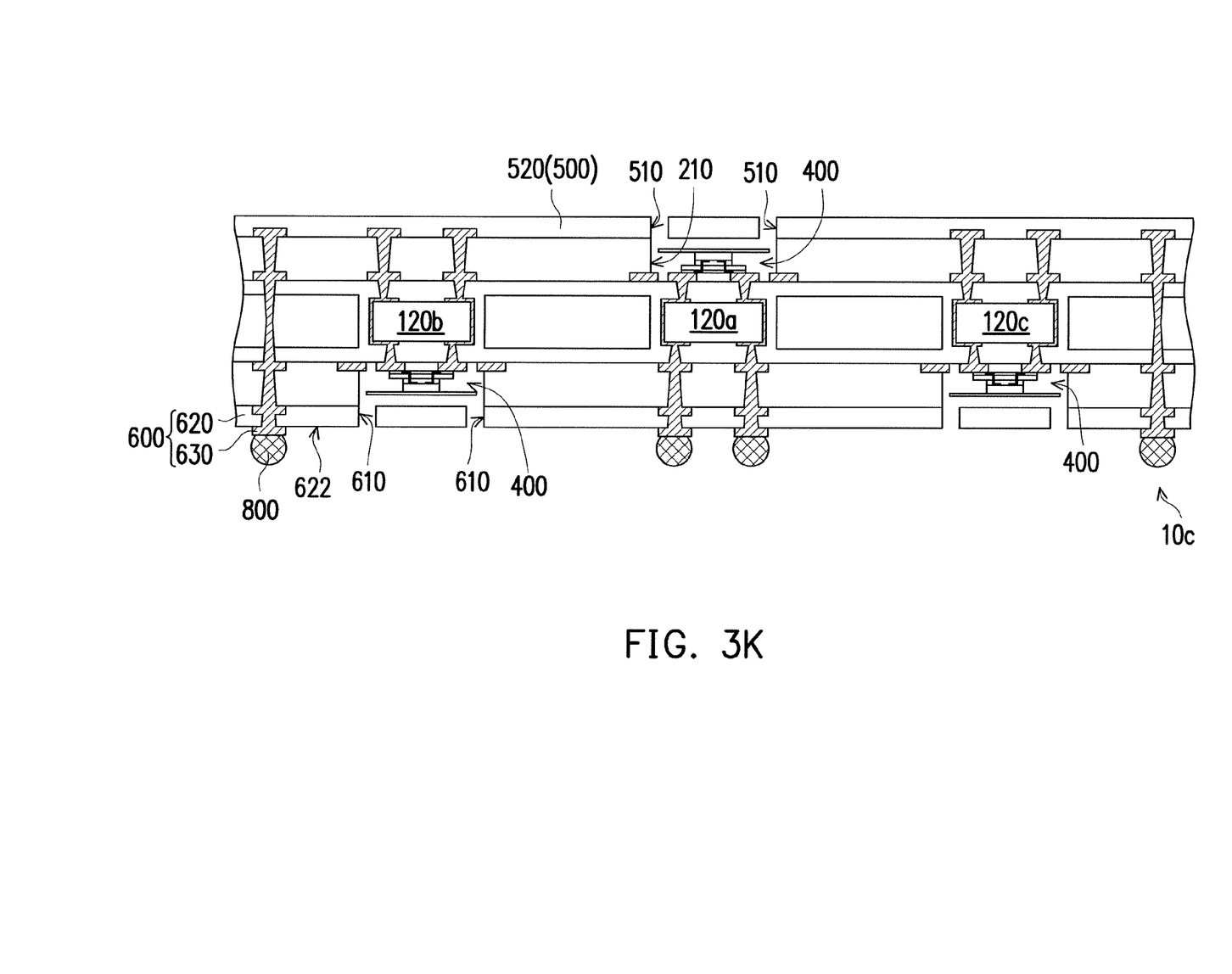
FIG. 3K shows a cross-sectional schematic diagram of a package structure of another embodiment of the invention.

To expand the application scope of the package structure 10b of the present embodiment, after the step of FIG. 3J, referring to FIG. 3K, a plurality of solder balls 800 can be formed on the conductive vias 630 extended and disposed on the outer surface 622 of the build-up dielectric layer 620 to complete the manufacture of a package structure 10c. The package structure 10c can be electrically connected to an external circuit (not shown) via the solder balls 800.

Based on the above, in the design of the package structure of the invention, the electronic devices are embedded in the core layer, and the active surfaces of two adjacent electronic devices respectively face opposite directions, and the piezoelectric heat dissipation units are disposed in the openings of the build-up circuit structure and correspond to the active surfaces of the electronic devices. In comparison to the known package structure in which the electronic devices are disposed on the outermost surface of the package carrier and the size of the body chamber is changed via the piezoelectric material attached to the metal cover for heat dissipation, in addition to preventing electromagnetic interference between the electronic devices, the package structure of the invention can also have a smaller package thickness and size to meet the needs of a thinner package structure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A package structure, comprising:
   a circuit substrate, comprising:
      a core layer having a first surface and a second surface opposite to each other;

a plurality of electronic devices embedded in the core layer, wherein each of the electronic devices has an active surface and a back surface opposite to each other, and the active surfaces of two adjacent electronic devices respectively face the first surface and the second surface of the core layer; and a conducting unit disposed on the first surface and the second surface of the core layer and extended to the electronic devices and electrically connected to the electronic devices;

a first build-up circuit structure disposed on the first surface of the core layer and having at least one first opening;

a second build-up circuit structure disposed on the second surface of the core layer and having at least one second opening, wherein the first opening and the second opening expose a portion of the conducting unit; and a plurality of piezoelectric heat dissipation units disposed on the conducting unit exposed by the first opening and the second opening and respectively corresponding to the active surfaces of the electronic devices, wherein the piezoelectric heat dissipation units are electrically connected to the conducting unit exposed by the first opening and the second opening.

2. The package structure as recited in claim 1, wherein the core layer comprises a dielectric layer and an insulating layer, the dielectric layer has an upper surface and a lower surface opposite to each other and a plurality of holes, the electronic devices are respectively disposed in the holes, and the insulating layer covers the upper surface and the lower surface of the dielectric layer and is filled in the holes to cover the electronic devices.

3. The package structure as recited in claim 1, wherein the conducting unit comprises:

a plurality of through-holes extended from the first surface and the second surface of the core layer to the electronic devices and electrically connected to the electronic devices;

a plurality of first pads disposed on the first surface and the second surface of the core layer, wherein the first pads are electrically connected to the active surfaces of the electronic devices via a portion of the through-holes;

a plurality of second pads disposed on the first surface and the second surface of the core layer and surrounding the first pads; and a plurality of third pads disposed on the first surface and the second surface of the core layer, wherein the third pads are electrically connected to the back surfaces of the electronic devices via another portion of the through-holes.

4. The package structure as recited in claim 3, wherein the first opening and the second opening expose the first pads and the second pads and the piezoelectric heat dissipation units are electrically connected to the first pads.

5. The package structure as recited in claim 4, wherein each of the piezoelectric heat dissipation units comprises:
an elastic sheet;
a piezoelectric block disposed on the elastic sheet;
a first adhesive layer disposed on the piezoelectric block;
a buffer layer disposed on the first adhesive layer;
a second adhesive layer disposed on the buffer layer; and
two electrode wires embedded in the second adhesive layer, the buffer layer, and the first adhesive layer, wherein each of the electrode wires has a first end and a second end opposite to each other, the first end is embedded in a surface of the second adhesive layer relatively far from the buffer layer and in direct contact with one of the first pads, and the second end is in direct contact with the piezoelectric block.

6. The package structure as recited in claim 3, wherein the first build-up circuit structure comprises a first dielectric layer and a plurality of first conductive vias, the first conductive vias pass through the first dielectric layer and are extended and disposed on a top surface of the first dielectric layer, and the first conductive vias are at least electrically connected to the third pads.

7. The package structure as recited in claim 3, wherein the second build-up circuit structure comprises a second dielectric layer and a plurality of second conductive vias, the second conductive vias pass through the second dielectric layer and are extended and disposed on a bottom surface of the second dielectric layer, and the second conductive vias are at least electrically connected to the third pads.

8. The package structure as recited in claim 1, wherein the circuit substrate further comprises:
a plurality of conductive columns passing through the core layer and extended and disposed on the first surface and the second surface of the core layer.

9. The package structure as recited in claim 1, further comprising:
a third build-up circuit structure covering the first build-up circuit structure and having a plurality of first heat dissipation holes, wherein the first heat dissipation holes are disposed corresponding to the first opening; and
a fourth build-up circuit structure covering the second build-up circuit structure and having a plurality of second heat dissipation holes, wherein the second heat dissipation holes are disposed corresponding to the second opening.

10. The package structure as recited in claim 9, wherein the fourth build-up circuit structure comprises a build-up dielectric layer and a plurality of build-up conductive vias, the build-up dielectric layer covers the second build-up circuit structure, the build-up conductive vias pass through the build-up dielectric layer and are extended and disposed on an outer surface of the build-up dielectric layer, and the build-up conductive vias are at least electrically connected to the second conductive vias.

11. A manufacturing method of a package structure, comprising:
providing a circuit substrate, the circuit substrate comprising:
a core layer having a first surface and a second surface opposite to each other;
a plurality of electronic devices embedded in the core layer, wherein each of the electronic devices has an active surface and a back surface opposite to each other, and the active surfaces of two adjacent electronic devices respectively face the first surface and the second surface of the core layer; and
a conducting unit disposed on the first surface and the second surface of the core layer and extended to the electronic devices and electrically connected to the electronic devices;
respectively forming a first build-up circuit structure and a second build-up circuit structure on the first surface and the second surface of the core layer, wherein at least one first opening and at least one second opening are respectively formed in the first build-up circuit structure and the second build-up circuit structure, and the first opening and the second opening respectively expose a portion of the conducting unit; and disposing a plurality of piezoelectric heat dissipation units on the conducting unit exposed by the first opening and the second opening, wherein the piezoelectric heat dissipation units respectively correspond to the active surfaces of the electronic devices, and the piezoelectric heat dissipation units are electrically connected to the conducting unit exposed by the first opening and the second opening.

12. The manufacturing method of the package structure as recited in claim 11, wherein the step of providing the circuit substrate comprises:

providing a dielectric layer, wherein the dielectric layer has an upper surface and a lower surface opposite to each other and a plurality of holes;

disposing the electronic devices in the holes of the dielectric layer;

forming an insulating layer on the dielectric layer, wherein the insulating layer covers the upper surface and the lower surface of the dielectric layer and is filled in the holes to cover the electronic devices;

forming a plurality of through-holes extended from the first surface and the second surface of the core layer to the electronic devices, wherein the through-holes are electrically connected to the electronic devices;

forming a plurality of first pads on the first surface and the second surface of the core layer, wherein the first pads are electrically connected to the active surfaces of the electronic devices via a portion of the through-holes;

forming a plurality of second pads on the first surface and the second surface of the core layer, wherein the second pads surround the first pads; and forming a plurality of third pads on the first surface and the second surface of the core layer, wherein the third pads are electrically connected to the back surfaces of the electronic devices via another portion of the through-holes, and the through-holes, the first pads, the second pads, and the third pads define the conducting unit.

13. The manufacturing method of the package structure as recited in claim 12, further comprising:

attaching a plurality of release films on the first pads and the second pads before the first build-up circuit structure and the second build-up circuit structure are formed on the first surface and the second surface of the core layer; and removing the release films after the first opening and the second opening of the first build-up circuit structure and the second build-up circuit structure are formed to expose the first pads and the second pads.

14. The manufacturing method of the package structure as recited in claim 12, wherein the first build-up circuit structure comprises a first dielectric layer and a plurality of first conductive vias, the first conductive vias pass through the first dielectric layer and are extended and disposed on a top surface of the first dielectric layer, and the first conductive vias are at least electrically connected to the third pads.

15. The manufacturing method of the package structure as recited in claim 12, wherein the second build-up circuit structure comprises a second dielectric layer and a plurality of second conductive vias, the second conductive vias pass through the second dielectric layer and are extended and disposed on a bottom surface of the second dielectric layer, and the second conductive vias are at least electrically connected to the third pads.

16. The manufacturing method of the package structure as recited in claim 12, wherein each of the piezoelectric heat dissipation units comprises:

an elastic sheet;
a piezoelectric block disposed on the elastic sheet;
a first adhesive layer disposed on the piezoelectric block;
a buffer layer disposed on the first adhesive layer;
a second adhesive layer disposed on the buffer layer; and
two electrode wires embedded in the second adhesive layer, the buffer layer, and the first adhesive layer, wherein each of the electrode wires has a first end and a second end opposite to each other, the first end is embedded in a surface of the second adhesive layer relatively far from the buffer layer and in direct contact with one of the first pads, and the second end is in direct contact with the piezoelectric block.

17. The manufacturing method of the package structure as recited in claim 12, wherein the step of providing the circuit substrate further comprises:

forming a plurality of conductive columns passing through the core layer and extended and disposed on the first surface and the second surface of the core layer.

18. The manufacturing method of the package structure as recited in claim 11, further comprising, after the piezoelectric heat dissipation units are disposed on the conducting unit exposed by the first opening and the second opening:

forming a third build-up circuit structure on the first build-up circuit structure, wherein the third build-up circuit structure covers the first build-up circuit structure and has a plurality of first heat dissipation holes, and the first heat dissipation holes are disposed corresponding to the first opening; and forming a fourth build-up circuit structure on the second build-up circuit structure, wherein the fourth build-up circuit structure covers the second build-up circuit structure and has a plurality of second heat dissipation holes, and the second heat dissipation holes are disposed corresponding to the second opening.

19. The manufacturing method of the package structure as recited in claim 18, wherein the fourth build-up circuit structure comprises a build-up dielectric layer and a plurality of build-up conductive vias, the build-up dielectric layer covers the second build-up circuit structure, the build-up conductive vias pass through the build-up dielectric layer and are extended and disposed on an outer surface of the build-up dielectric layer, and the build-up conductive vias are at least electrically connected to the second conductive vias.

20. The manufacturing method of the package structure as recited in claim 19, further comprising, after the fourth build-up circuit structure is formed:

forming a plurality of solder balls on the conductive vias extended and disposed on the outer surface of the build-up dielectric layer.

* * * * *